US009141174B2

(12) United States Patent
Unterreitmayer et al.

(10) Patent No.: US 9,141,174 B2
(45) Date of Patent: Sep. 22, 2015

(54) ELECTRODE SYSTEM FOR PROXIMITY DETECTION AND HAND-HELD DEVICE WITH ELECTRODE SYSTEM

(71) Applicant: Microchip Technology Incorporated, Chandler, AZ (US)

(72) Inventors: Reinhard Unterreitmayer, Gauting (DE); Stefan Donat, Gilching (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 55 days.

(21) Appl. No.: 13/947,424

(22) Filed: Jul. 22, 2013

(65) Prior Publication Data

US 2014/0191969 A1    Jul. 10, 2014

Related U.S. Application Data

(63) Continuation of application No. 12/519,185, filed on Jun. 30, 2009, now Pat. No. 8,493,074.

(30) Foreign Application Priority Data

| Apr. 25, 2008 | (DE) | 10 2008 020 819 |
| Apr. 7, 2009 | (DE) | 10 2009 016 355 |
| Apr. 7, 2009 | (DE) | 10 2009 016 356 |
| Apr. 16, 2009 | (WO) | PCT/EP2009/054570 |

(51) Int. Cl.
*G01R 27/00* (2006.01)
*G06F 1/32* (2006.01)
(Continued)

(52) U.S. Cl.
CPC ............ *G06F 1/3259* (2013.01); *G06F 1/3203* (2013.01); *G06F 1/3231* (2013.01);
(Continued)

(58) Field of Classification Search
CPC ... G06F 1/3231; G06F 1/3259; G06F 1/3203; H03K 17/962
See application file for complete search history.

(56) References Cited

U.S. PATENT DOCUMENTS

| 4,016,490 A | 4/1977 | Weckenmann et al. ........ 324/671 |
| 6,597,182 B1 | 7/2003 | Tachibana ..................... 324/600 |

(Continued)

FOREIGN PATENT DOCUMENTS

| GB | 2398138 A | 8/2004 | ................ G06F 1/32 |
| JP | 2004240971 A | 8/2004 | ................ G06F 1/32 |
| JP | 2007116684 A | 5/2007 | ................ G01V 1/00 |

OTHER PUBLICATIONS

International Search Report and Written Opinion, Application No. PCT/EP2009/054570, 12 pages, Apr. 7, 2010.

(Continued)

*Primary Examiner* — Tung X Nguyen
(74) *Attorney, Agent, or Firm* — Slayden Grubert Beard PLLC

(57) ABSTRACT

An electrical hand-held device is provided with improved proximity detection, which can be placed on a surface and has at least one transmission electrode, at least one reception electrode and at least one compensation electrode arranged between transmission electrode and reception electrode. The transmission electrode and the compensation electrode can be supplied with an electric switching signal of predetermined signal frequency and predetermined signal amplitude. Switching electric signal at the compensation electrode is phase-delayed with respect to the switching electric signal at the transmission electrode. Alternating electric fields radiated at the transmission electrode and the compensation electrode generate a current in the reception electrode, which is representative of an approach of a hand to the hand-held device.; The transmission electrode and the reception electrode are arranged in such a way, that the impedance between the transmission electrode and the reception electrode exceeds a predetermined value, which is suitable to keep the current generated in the reception electrode under a predetermined value.

22 Claims, 15 Drawing Sheets

(51) Int. Cl.
  G06F 3/0354 (2013.01)
  H03K 17/96 (2006.01)
  *H03K 17/955* (2006.01)
  *H04W 52/02* (2009.01)

(52) U.S. Cl.
  CPC .......... G06F3/03543 (2013.01); H03K 17/962 (2013.01); *A63F 2300/1012* (2013.01); *H03K 17/955* (2013.01); *H03K 2217/960755* (2013.01); *H03K 2217/960775* (2013.01); *H04M 2250/12* (2013.01); *H04W 52/0254* (2013.01); *Y02B 60/1217* (2013.01); *Y02B 60/1253* (2013.01); *Y02B 60/1289* (2013.01); *Y02B 60/148* (2013.01)

(56) References Cited

U.S. PATENT DOCUMENTS

| | | | |
|---|---|---|---|
| 6,664,661 B1 | 12/2003 | Palata et al. | 307/112 |
| 6,859,141 B1 | 2/2005 | Van Schyndel et al. | 340/562 |
| 6,977,675 B2 | 12/2005 | Kotzin | 348/208.2 |
| 7,199,783 B2 | 4/2007 | Wenstrand et al. | 345/156 |
| 8,493,074 B2 * | 7/2013 | Unterreitmayer et al. | 324/600 |
| 2004/0169637 A1 | 9/2004 | Sato | 345/156 |
| 2005/0156876 A1* | 7/2005 | Kong | 345/156 |
| 2006/0164241 A1 | 7/2006 | Makela et al. | 340/556 |
| 2006/0250142 A1 | 11/2006 | Abe | 324/663 |
| 2007/0075986 A1 | 4/2007 | Chen | 345/173 |
| 2008/0152263 A1 | 6/2008 | Harrison | 382/313 |

OTHER PUBLICATIONS

Chinese Office Action, Application No. 200980000516.3, 11 pages, Jul. 31, 2012.

Japanese Office Action, Application No. 2011-505467, 10 pages, Apr. 9, 2013.

* cited by examiner

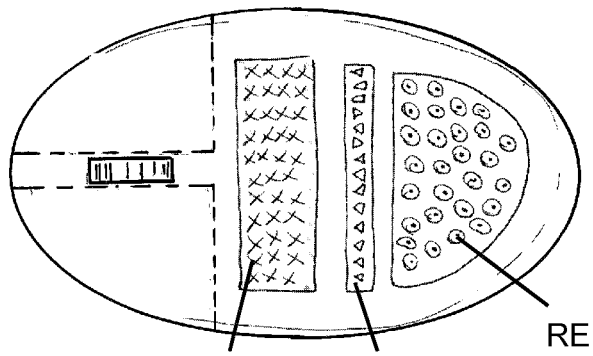
Fig. 13a  TE  CE  RE
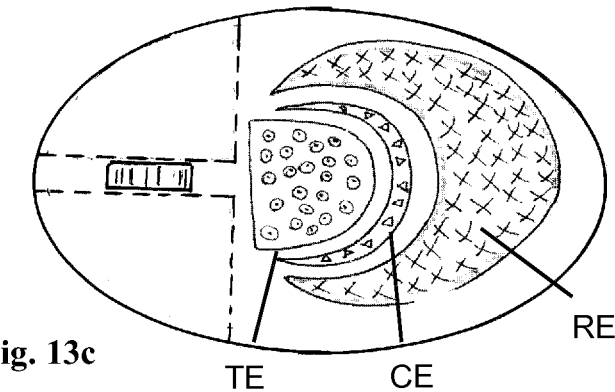
Fig. 13b  TE  CE  RE
Fig. 13c  TE  CE  RE

RE    CE    TE

RE    CE    TE

ELECTRODE SYSTEM FOR PROXIMITY DETECTION AND HAND-HELD DEVICE WITH ELECTRODE SYSTEM

CROSS-REFERENCE TO RELATED APPLICATIONS

This application is a continuation of U.S. patent application Ser. No. 12/519,185 filed on Jun. 30, 2009, now U.S. Pat. No. 8,493,074 issued on Jul. 23, 2013, which is a U.S. National Stage Application of International Application No. PCT/EP2009/054570 filed on Apr. 16, 2009, which designates the United States of America, and claims priority to DE Patent Application No. 10 2008 020 819.1 filed Apr. 25, 2008, DE Patent Application No. 10 2009 016 355.7 filed Apr. 7, 2009 and DE Patent Application No. 10 2009 016 356.5 filed Apr. 7, 2009, the contents of which are hereby incorporated by reference in their entirety.

TECHNICAL FIELD

The invention refers to an electrode system for proximity detection, as well as to an electrical hand-held device with electrode system, which can be placed on a surface support and, when using a sleeping mode, can be switched to an active mode and in which the areas where the hand-held device is touched can be detected.

The invention also refers to an input device with the electrode system for a computerized information system, especially in the form of a computer mouse, which as such allows the processing of input processes when using a computer, especially in case of CAD-applications, of text and image processing applications, of programming works, of calculation applications, Internet navigation, as well as games.

Moreover the invention refers to an input device for game consoles and to a mobile phone, in which the input device for game consoles and for the mobile phone are equipped with the electrode system.

BACKGROUND

In the state of the art of electric devices and especially of electric hand-held devices the continuing wish emerges to improve energy efficiency. Especially in the case of portable hand-held devices, such as remote controls, input devices for game consoles or mobile phones, using exchangeable batteries or accumulators for power supply, such a wish is amplified, since batteries or accumulators must be frequently changed. An improved energy efficiency lowers on the one hand the power consumption, which leads to a higher battery or accumulator lifetime and produces on the other hand an advantageous ecologic effect, since fewer batteries or accumulators need to be disposed.

In the state of the art it is known that hand-held devices should be switched to a so-called sleeping mode when not in use. In the sleeping mode all the functions of the hand-held device, which are only necessary when using the device, are deactivated. In this way the power input of the device can be significantly reduced. When in use the hand-held device is switched to a so-called active mode, in which the full functional capacity of the device is made available.

In order to switch a hand-held device to the sleeping mode on one hand and from the sleeping mode to the active mode on the other hand, it is known that switches are provided with which the respective mode can be manually activated. This has the disadvantage that hand-held devices, also when not in use, such as for example in case of a computer mouse, often remain in the active mode, since a manual activation or deactivation of the active mode seems relatively complicated or easy to forget. Therefore, the desired energy efficiency improvement is not achieved to a great extent.

Usually computer mice allow the generation of X/Y control data by means of the corresponding movement of the computer mouse on or against a surface. These computer mice are further equipped with a key device through which selection operations can be performed. Moreover, computer mice are also often equipped with a scroll wheel through which input signals can also be generated. The keys and/or the scroll wheel of the computer mouse are also frequently developed as to bring the computer mouse into the sleeping mode or into the active mode. This requires, however, a manual action of the user.

Computer mice are increasingly formulated as cordless devices. The power supply of the computer mouse typically occurs by means of batteries or accumulators. In case of such mice, differently from conventional wired mice, an issue is that batteries need to be frequently replaced or that accumulators need to be frequently charged.

In order to avoid a manual activation or deactivation of the hand-held device active mode, the GB 2 398 138 A suggests providing the hand-held device with a wake detector, which includes a capacity sensor. When a hand-held device gets close or in contact with a hand, the hand-held device switches to the active mode automatically. When a hand is removed the hand-held device switches automatically to the sleeping mode. To detect the approaching of the hand, the capacity of the capacity sensor, which changes with the approach, is measured, in which a predetermined capacity constitutes the switching threshold for the wake detector.

Experiments have shown that such a wake detector has the disadvantage that the approaching of a hand to the wake detector is not reliably detected or, in the worst of cases, is even wrongly detected. This is especially the case, when a hand-held device is placed on an electrically conductive material, such as a table with a metal plate. Thus, the wake detector cannot reliably distinguish the electrically conductive surface from a hand. Therefore, there is the danger that the wake detector detects a hand by mistake, and the wake detector consequently switches the hand-held device to the active mode. This again remarks the fact that only a part of the desired energy efficiency improvement is achieved.

Another disadvantage of the solutions known from the state of the art, is that the approaching to different areas of a hand-held device or an approach from different directions is not detectable. Equally, with the known solutions it cannot be determined which areas of the hand-held device are to be touched.

The task of the present invention is that of creating solutions for an electrical hand-held device, by means of which the approaching of a hand to the hand-held device can be reliably detected and areas of a hand-held device can be identified where an approach and/or a contact occurs or the direction from which the approaching comes.

SUMMARY

According to various embodiments, a hand-held device and an electrode system as explained in more detail below can be provided.

According to an embodiment, an electrical hand-held device, which can be placed on a surface, is provided with at least one transmission electrode, at least one reception electrode and at least one compensation electrode arranged between the transmission electrode and the reception electrode, by means of which the approach of a hand to the hand-held device is detectable, in which from the transmission electrode a first electrical alternating field can be radiated and from the compensation electrode a second electrical alternating field can be radiated, in which the first alternating electric field with respect to the second alternating electric field is phase-delayed and in which the alternating electric fields can be coupled into the surface and into the reception electrode, in which the alternating electric fields coupled into the reception electrode generate a current in the reception electrode, which is representative of the approaching of the hand to the hand-held device, in which the transmission electrode and the reception electrode on the hand-held device are arranged in such a way that the sum of the impedances between the transmission electrode and the reception electrode, which consists of the impedance between the transmission electrode and the surface, the impedance of the surface and the impedance between the surface and the reception electrode exceeds a predetermined value $Z_0$ as the hand-held device is placed on the surface, which is suitable to keep the current generated in the reception electrode under a predetermined value $I_0$.

Being between the transmission electrode and the reception electrode at least one compensation electrode arranged, it is possible, in an easier and more reliable way, to detect the approach of a hand to the hand-held device, even if the hand-held device is placed on an electric conductive surface. Through the corresponding arrangement of the transmission electrode and of the reception electrode, in which the impedance between the transmission electrode and the reception electrode exceeds a predetermined value $Z_0$, the current generated through the alternating electric fields in the reception electrode does not suffice to switch the hand-held device from a sleeping mode into an operational or active mode. With the help of the alternating electric field emitted at the compensation electrode, a sufficiently high current from the transmission electrode to the receiver electrode (roughly over the wall of the hand-held device) is moreover prevented, which would suffice to switch the hand-held device to the active mode.

An approach can include a reduction of the distance between hand and hand-held device and/or a change of the position of the hand with respect to the electrodes on the hand-held device.

The transmission electrode and the compensation electrode can be supplied with an electric alternating quantity of predetermined frequency and predetermined amplitude, whereas the electric alternating quantity at the transmission electrode with respect to the electric alternating quantity at the compensation electrode is phase-delayed. The amplitude of the electric alternating quantity at the transmission electrode can be different from the amplitude of the electric alternating quantity at the compensation electrode.

With the increasing approach of a hand to the hand-held device, the alternating electric field transferred through the hand from the transmission electrode to the reception electrode experiences a fader and fader compensation through the alternating electric field of the compensation electrode.

The surface also comprises contact surfaces. A contact surface can be for example a wall, on which the hand-held device is arranged in the form of a tiltable lever.

Moreover an electrical hand-held device is provided, which can be placed on a surface, showing several electrode structures or electrode systems, in which respectively at least one transmission electrode, at least one reception electrode and at least one compensation electrode between the transmission electrode and the reception electrode are arranged, in which with any of the several electrode structures an approach of a hand to the hand-held device can be detected, in which any of the several electrode structures is developed in such a way, that from the transmission electrode a first electrical alternating field and from the compensation electrode a second electrical alternating field are radiated, in which the first alternating electric field with respect to the second alternating electric field is phase-delayed and in which the alternating electric fields can be coupled into the surface and into the reception electrode, the alternating electric fields coupled into the reception electrode generate a current in the reception electrode, which is representative of the approach of a hand to the electrode structure on the hand-held device, and the transmission electrode and the reception electrode are arranged in such a way on the hand-held device, that the sum of the impedances between the transmission electrode and the reception electrode, which consists of the impedance between the transmission electrode and the surface, the impedance of the surface and the impedance between the surface and the reception electrode exceeds a predetermined value when a hand-held device is placed on the surface, which is suitable to keep the current generated in the reception electrode under a predetermined value.

The provision of several such electrode structures allows to advantageously detect the approaching of a hand to several areas of the hand-held device or to reliably identify the direction of the approach.

The several electrode structures can be coupled with an electronic evaluation device, in which the electronic evaluation device is developed to successively evaluate the approach of a hand to each of the several electrode structures.

The several electrode structures can also be coupled with a respective electronic evaluation device, in which each electronic evaluation device is formulated to evaluate the approach of a hand to the respective connected electrode structure.

It is advantageous when the transmission electrode, the compensation electrode and the reception electrode of each of the several electrode structures are arranged on the hand-held device in such a way that they do not touch the surface when the hand-held device is placed on the surface.

With this advantageous arrangement, the production of a galvanic contact between the transmission electrode and the reception electrode is avoided, when the hand-held device is placed on an electrically conductive surface, which could reduce the sensitivity of the detection.

The transmission electrode, the compensation electrode and the reception electrode of each of the electrode structures can be arranged on the surface of the hand-held device.

The transmission electrode, the compensation electrode and the reception electrode of each of the electrode structures can also be arranged on the side of the hand-held device facing the surface.

The surface of the hand-held device also comprises the external sides of the hand-held device. In this way for example any single electrode or all electrodes can be arranged on the outside and be visible to the user. Single or all electrodes can however also be directly arranged below the surface of a hand-held device, so that they are not visible to the user and they are additionally better protected.

Advantageously, in any of the several electrode structures, the alternating electric field radiated at the compensation electrode, interferes at least partially with the alternating electric field radiated at the transmission electrode, which determines a reduction in the level of the alternating electric field resulting from the superposition and which leads to a reduction of the current generated into the reception electrode.

Another advantage of the compensation electrode consists in the fact that besides the alternating electric field, emitted at the transmission electrode, also the alternating electric field emitted at the compensation electrode is coupled in the surface, so that, regardless of the surface material, the alternating electric field emitted at the compensation electrode interferes with the alternating electric field emitted by the transmission electrode. In this way an approaching of a hand, regardless of the surface material, can be reliably detected.

In any of the several electrode structures a first approach of a hand to the hand-held device can cause a change of the sum of the impedances between the transmission electrode and the reception electrode, comprised between the predetermined value $Z_0$ and a further predetermined value $Z_1$, with $Z_0 > Z_1$, and which is suitable to bring the current generated in the reception electrode over the predetermined value $I_0$.

The first approach can for example comprise a distance of a hand from the electrodes and/or a position of a hand with respect to the electrodes.

In each of the several electrode structures, a second approach of a hand to a hand-held device can cause a change of the sum of the impedances between the transmission electrode and the reception electrode, which is below the further predetermined value $Z_1$ and which is suitable to bring the current generated in the reception electrode over a second predetermined value $I_1$, with $I_1 > I_0$.

The second approach can further include a distance of a hand from the electrodes and/or a position of a hand with respect to the electrodes, in which the second approach is different from the first approach. So the distance of a hand from the electrodes in the second approach can be for example smaller than that in the first approach in order to cause an increase of the amperage in the reception electrode over the predetermined value $I_1$.

Equally the amperage increase in the reception electrode over the predetermined value $I_1$ can be achieved through the position of the hand with respect to the electrodes, even when the distance of the hand in the second approach is smaller than in the first approach.

The arrangement of the electrodes has the advantage that in an approach of a hand to the hand-held device or in the gripping of the hand-held device, the impedance between the transmission electrode and the reception electrode decreases in such a way that the alternating electric field coupled into the reception electrode suffices to bring the current generated in the reception electrode over a first value $I_0$ (when approaching) or over a second value $I_1$ (when gripping or with a further approach).

In this way a sleeping mode, a switch mode and an active mode of the hand-held device, can be advantageously induced with a control means coupled with the reception electrode in which the currents $I_0$ and $I_1$ serve as threshold values. The provision of a switch mode (as inter-stage between the sleeping mode and the active mode) has the further advantage that already in a corresponding approach of a hand, the hand-held device can be prepared for the active mode, for example by starting an initialization process. The feeling of a delayed activation can therefore be avoided by the user of the hand-held device.

It is particularly advantageous to construe the transmission electrode, the reception electrode and the compensation electrode of at least one of the several electrode structures in such a way that the approaching of the hand to the hand-held device causes a rise in the level of the alternating electric field resulting from the interference, and a reduction of the impedance between the transmission electrode and the reception electrode.

It is particularly advantageous, when the ratio of the level $P_1$ of the resulting alternating field in the first approach with respect to the level $P_2$ of the resulting alternating field in the second approach is smaller than the ratio of the impedance $Z_2$ between transmission electrode and reception electrode in the second approach with respect to the impedance $Z_1$ between transmission electrode and reception electrode in the first approach. Levels and impedances in the first and second approach behave to one another as follows:

$$\frac{P_1}{P_2} < \frac{Z_2}{Z_1}$$

In this way it is possible to advantageously guarantee, that as the approach of a hand to a hand-held device increases, also an activation of the switch mode or the active mode occurs, since the sensitivity of the electrode arrangement on the hand-held device improves as the hand approaches.

The transmission electrode, the reception electrode and the compensation electrode of at least one of the several electrode structures can be asymmetrically arranged to determine a left/right-distinction of the approaching hand. Depending on the distinction, a predetermined function of the device can also be performed.

With a left/right-distinction of the approaching to the hand-held device, a distinction between right-handed and left-handed can also be advantageously performed, in order to arrange a menu direction on a display provided on the hand-held device on the left or on the right of the display accordingly.

The alternating electric field radiated from at least one compensation electrode of the several electrode structures can be provided for an adaptation of the predetermined values $I_0$ according to the electric field surrounding the hand-held device.

The threshold value of the current, being sufficient for a hand-held device to pass from the sleeping mode to the switch mode or to the active mode, can therefore be adapted through the hand-held device itself to different surface materials.

With the arrangement of several electrode structures on a hand-held device it is possible to detect in a particularly simple way, if a user holds a hand-held device with a hand or with both hands, preferably in specific areas of the hand-held device.

For the accomplishment of the task, a hand-held device is also provided with: a casing device, a shifting detection device to generate control data which correlate as such with the shifting of the case device into a X- and a Y-axial direction, and a hand detection device to generate signals which describe as such the approach status of a hand with respect to the casing device, in which: the hand detection device comprises an electrode group with three field electrodes, and a circuit device coupled with these field electrodes, the circuit device is constructed in such a way that the field electrodes are respectively supplied with a generator voltage alternating on an operating frequency, and a tapping circuit is provided to generate an electrode signal that is conducted to a signal control unit.

The hand-held device can be for example a computer mouse, an input device for game consoles, a mobile phone or a portable minicomputer.

In this way it is advantageously possible, with an extremely small power demand, to perform a detection of approaching occurrences and to activate the remaining electronics of an hand-held device, for example mouse electronics, only when an approach of a hand is detected.

Preferably the tapping circuit is developed in such a way that the impedance at the signal input shows a minimum amount in the operating frequency range. In this respect the signal amplification is handled preferably in such a way that in case of the smallest possible steepness, it experiences an operationally stable maximum.

In advantageous way, successive further signal amplification occurs, in which the output impedance of tapping circuit is preferably coordinated in such a way that at the exit of tapping circuit, a DC-output signal deriving directly from the AC-input signal of the field electrode occurs. This DC-output signal is conducted to a signal control unit performed as a module enclosed in it.

Preferably, the generator device is directly included into the signal control unit. It is possible to connect the tapping circuit to the signal control unit in such a way that the first reinforcing step of the tapping circuit through the signal control device is supplied with a voltage.

The signal control device is preferably laid out in such a way that a sleeping mode and an active mode can be determined through it. In the course of the sleeping mode the detection of the approaching status takes place at intervals separated by pauses.

According to a further embodiment, an electrode system can be provided to be arranged on a hand-held device with at least one transmission electrode, one reception electrode and one compensation electrode, in which the compensation electrode can be arranged between the transmission electrode and the reception electrode, in which the electrode system is developed in such a way that from the transmission electrode a first alternating electric field and from the compensation electrode a second alternating electric field are radiated, in which the first alternating electric field is phase-delayed with respect to the second alternating electric field and in which the alternating electric fields can be coupled into the reception electrode, and the alternating electric fields coupled into the reception electrode generate a current in the reception electrode, which is representative of an approach of a hand to the electrode system.

It is advantageous when the transmission electrode and the reception electrode are arranged on the hand-held device in such a way that the impedance between the transmission electrode and the reception electrode, in case the hand-held device is placed on a surface, exceeds a predetermined value $Z_0$, which is suitable to hold the current generated in the reception electrode under a predetermined value.

The approaching of a hand to the electrode system on a hand-held device can therefore be reliably detected regardless of the material of the surface on which hand-held device is placed.

The impedance between the transmission electrode and the reception electrode is, in case of a hand-held device placed on the support surface, the sum of the impedances between the transmission electrode and the reception electrode, which consists of the impedance between the transmission electrode and the surface, the impedance of the surface and the impedance between the surface and the reception electrode.

The electrode system can be coupled with an electronic evaluation device, in which the electronic evaluation device is preferably adapted to evaluate an approach of a hand to the electrode system and to provide a signal representative of the approach. The signal can for example be conducted for further processing to a microcontroller, for example the control unit of a game console.

According to yet another embodiment, a hand-held device can be provided, in particular a computer mouse, a remote control device, a mobile phone or an input device for a game console, with at least one electrode system according to various embodiments.

In case of a hand-held device with several electrode systems an approach to any of the electrode systems can be detected. In this way for example a hand-held device can be provided, which can be only activated, when it is touched with both hands on determined areas.

BRIEF DESCRIPTION OF THE DRAWINGS

Further details and characteristics of the various embodiments derive from the following description associated with the drawing. It shows:

FIGS. 13a-13j further representations to illustrate variants according to an embodiment of the conformation of the electrode trio according to an embodiment;

DETAILED DESCRIPTION

Figure 1:
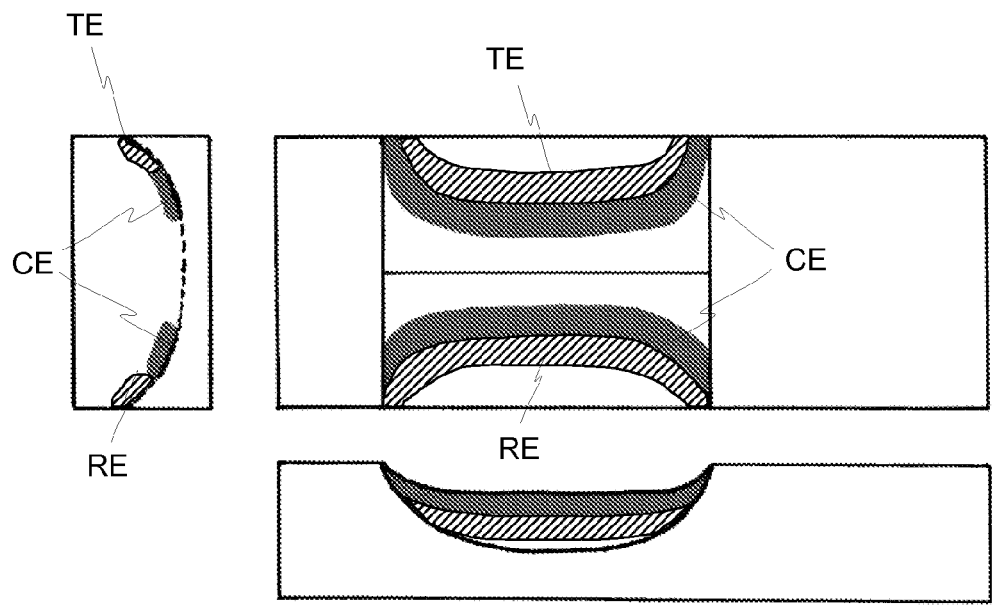
FIG. 1 a hand-held device with an electrode arrangement according to an embodiment (bottom view as well as a corresponding cross-section and longitudinal section)

The basic functioning of an approach detection according to an embodiment e.g. of a hand to a hand-held device is initially explained.

According to an embodiment, three electrodes are provided for approach detection. These three electrodes are indicated as transmission electrode TE, reception electrode RE and compensation electrode CE. The reception electrode RE is connected to the signal input of an evaluation device or of a control device. The transmission electrode TE and the compensation electrode CE are each coupled with a signal generator, which provides an electric alternating quantity with a determined frequency and amplitude. This electric alternating quantity is in the following indicated as alternating signal or electric alternating signal.

The transmission electrode TE, the reception electrode RE and the compensation electrode CE build, according to an embodiment, an electrode structure or an electrode system. Several such electrode structures or electrode systems can be provided on a hand-held device, in which each of the electrode systems for the approach detection of a hand can be provided on the hand-held device. Such a hand-held device is described more closely with reference to FIG. 6 and FIG. 7.

The electrodes TE, RE and CE are arranged for example at the bottom of a hand-held device, for example a remote control. The compensation electrode CE is preferably arranged between the transmission electrode TE and the reception electrode RE, as shown for example in FIG. 1 or FIG. 5.

The transmission electrode TE is supplied by the signal generator with an electric alternating signal, which can have a frequency, comprised between 50 KHz and 300 KHz and amplitude, which should not exceed the value of 20 V, so that it doesn't determine an unpleasant feeling in the user.

The compensation electrode CE is also supplied with an electric alternating signal, which has preferably the waveform and the frequency of the electric alternating signal with which the transmission electrode TE is supplied. The electric alternating signal of the compensation electrode CE is phase-delayed with respect to the electric alternating signal of the transmission electrode TE. The phase shifting can be accomplished for example with a phase-shifter, arranged between the signal generator and the transmission electrode or the compensation electrode.

The transmission electrode TE or the electric alternating signal supplied to it is laid out in such a way, that the alternating electric field emitted by the transmission electrode TE can be coupled in the reception electrode RE. The compensation electrode CE or the electric alternating signal supplied to it is laid out in such a way that the alternating electric field emitted by it can also be coupled into the reception electrode RE. Through the alternating electric field emitted at the compensation electrode CE, which is phase-delayed with respect to the alternating electric field emitted by the transmission electrode, the level of the alternating electric field acting on the reception electrode RE is reduced or in case of an opposite-phase interference (almost) deleted.

In case several electrode systems are provided on a hand-held device, which should detect an approach independently of each other, attention should be paid to the fact that the electrode systems do not interfere in such a way that a reliable detection can no longer be guaranteed. Such an arrangement can be empirically determined according to the casing. In an embodiment, which is not closely described here, between the electrode systems at least one additional compensation electrode can be provided. This additional compensation electrode can for example be used to delete the alternating electric field radiated by a transmission electrode of an electrode system, so that it does no longer affect the reception electrode of the other electrode system.

With the approaching of a hand to the electrodes the alternating electric field acting on the reception electrode RE is modified so that it generates a current on the reception electrode RE, which is representative of an approach of a hand to the electrodes. In case of a hand approaching to the electrodes, the coupling between transmission electrode TE and reception electrode RE through the hand improves. This improving coupling leads to have a current increase in the reception electrode. The correlation between an approaching hand and the current generated on the reception electrode is described more closely with reference to figures from 2a to 2c.

The overall system is laid out in such a way that, as long as no hand is near the electrodes, the current generated on reception electrode RE does not exceed a predetermined value. This is achieved though a corresponding arrangement of the transmission electrode TE and the reception electrode RE in the casing. The arrangement is done in such a way that the impedance between transmission electrode TE and reception electrode RE is big enough, so that in the reception electrode RE only one current is generated, which does not suffice to transfer the device from the sleeping mode to the switch mode.

The approach detection principle lies in the detection of a sufficiently ample electric value, which is representative of the admittance between the transmission electrode TE and the reception electrode RE. This is accomplished by measuring the amperage in the receiver or in the reception electrode RE. Basically, the amperage measured between the transmission electrode TE and the reception electrode RE grows with the increase of the electrode surfaces and diminishes with the increase of the current electrode spacing. Thus, similar laws apply as for the effective capacity in a plate capacitor.

In order to guarantee a particularly good detection of an approaching hand, compensation current is provided in the transmission system between transmission electrode TE and reception electrode RE. This (for the transmission current phase-delayed or opposite-phase) compensation current interferes with the transmission current. The freedom degrees to determine the compensation current strength lie in the first place in the measurements of the connected electrode surfaces. In the second place the phase of the compensation current (with reference to transmission current) can be varied. Eventually, an adaptation of the alternating signal as for frequency and/or voltage can also occur.

In an embodiment the quantity of the available freedom degree is reduced, in that it works only with firmly impressed voltages at transmission electrode TE and at the compensation electrode CE.

Further freedom degrees are omitted when the coarse tuning of the measuring system takes place only once in the construction of the overall system. This coarse tuning consists on the one hand in the single determination of the arrangement and profile of all performed electrodes on the hand-held device and on the other hand in the single adjustment of the phase difference between transmission and compensation signal.

The remaining freedom degrees are used for a fine-tuning of the measuring arrangement. They lie for example in a dynamic vernier adjustment of the phase difference between the transmission and compensation signal and/or in the position shifting of threshold value points, that are typically used to transfer an analogue transmission parameter into a logic derived switching function. The calculation of this electric threshold values can derive for example from firmly preset standard values in the controlling firmware and/or from already validated measured quantities and/or measuring profiles, which are for example cyclically firmly deposited in the memory area of the evaluating digitalization. In the fine-tuning also past measured values can flow in.

The precise arrangement of the single electrodes on the housing or the respective measures as well as the precise characteristics (frequency and amplitude) of the alternating electric signal, with which transmission electrode TE and compensation electrode CE are supplied, depend on the actual shape and size of the device. Electrode arrangement, electrode measures and characteristics of the alternating signal can be empirically determined for an actual device and mutually calibrated to one another so that the above described requirements referring to the current generated at the reception electrode RE are able to allow a reliable detection.

An example of a possible electrode arrangement at the bottom of a hand-held device is described in FIG. 1.

FIG. 1 shows a possible arrangement of a transmission electrode TE, a reception electrode RE and a compensation electrode CE at a remote control device (viewed on the device bottom as well as on each section along the transverse and longitudinal axis of the remote control device). The compensation electrode CE is arranged between transmission electrode SE and reception electrode RE. The alternating electric field acting on the reception electrode RE will be dampened or extinguished, depending on the compensation electrode CE emitted in the alternating electric field.

In FIG. 1 it can be seen, that the arrangement of electrodes and especially transmission electrode TE and reception electrode RE are arranged on the equipment bottom in such a way, that they do not touch a surface when placed thereon. This arrangement is important particularly in case of conductive electric surfaces, in order to avoid a direct current path between transmission electrode TE and reception electrode RE, which could withdraw from the influence sphere of the compensation electrode CE.

The two compensation electrodes CE shown in FIG. 1 can be electrically connected to each other. Alternatively one of the compensation electrodes CE may also be provided for the system adjustment. For this purpose both compensation electrodes CE must not be electrically connected to each other.

The electrodes shown in FIG. 1 may also be comparably arranged in a mobile phone or an input device for game consoles.

Figure 2A:
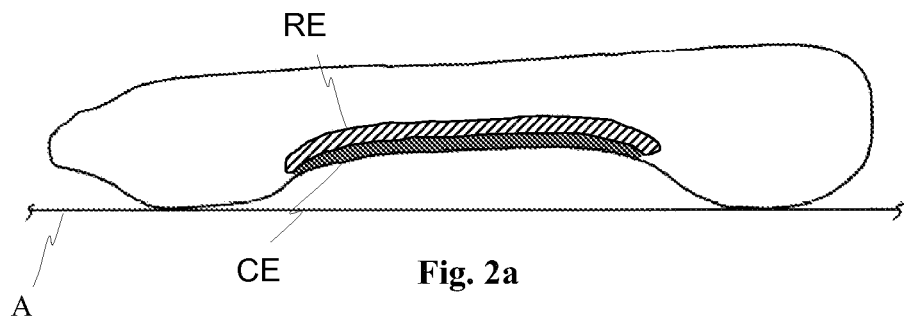
FIGS. 2a-2c side view of a hand-held device, in its sleeping mode (without hand), in its switch mode (when a hand approaches) and in its active mode (when a hand grips the hand-held device)
Figure 2B:
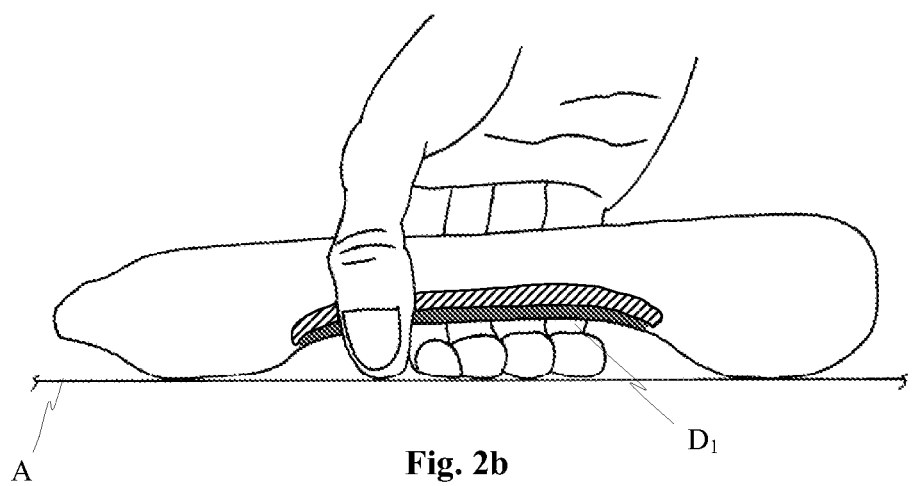
Figure 2C:
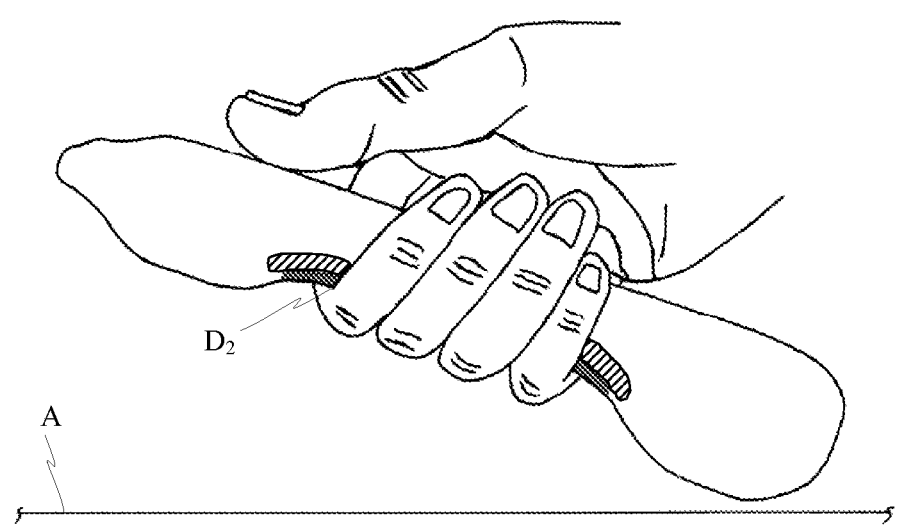

With reference to the drawings shown from FIG. 2a to FIG. 2c the functioning of the electrode arrangement is explained more closely.

FIG. 2a shows a remote control device placed on a surface A without approach of a hand. The remote control device is set on the "sleeping mode", in which the power need throughout the remote control device can be reduced to a minimum.

FIG. 2b shows a remote control device with an approaching hand $D_1$. For this purpose the remote control device "awakes" from the sleeping mode and shifts into a "switch mode". In the switch mode various activation or initialization functions can be performed, so that when the remote control device is gripped, its functions are fully available.

An example of an activation function is the switching on of a remote control device display. Another example is the switching on of a key lighting. The activation function can be set in combination with a photosensor, so that the key lighting only activates beneath a predetermined light intensity.

FIG. 2c shows a remote control device, held by a human hand $D_2$. The remote control device is now set in the "active mode" and is made available with its full unrestricted functioning.

Transmission electrode TE and reception electrode RE are arranged at the housing bottom (of also FIG. 1), so that the sum of impedances between the transmission electrode TE and the reception electrode RE is big enough, so that the emitted field of the transmission electrode TE experiences in any circumstance a sufficient damping. Through the damping signal in reception electrode only a current is generated, which does not suffice to switch the device from the sleeping mode into the switch mode. The electrode geometry of both electrodes as well as their arrangement to one another can be determined with predetermined generator voltage and generator frequency simply in an empirical way. In this way the electrode surface of the single electrodes and/or the distance between electrodes and/or the position of electrodes, and/or electrode material, can be adapted to one another in order to achieve corresponding impedance between the transmission electrode SE and the reception electrode RE.

The sum of the impedances between the transmission electrode TE and the reception electrode RE consists of: impedance between transmission electrode TE and surface, impedance of the surface itself, and impedance between surface and reception electrode RE.

The impedance of the surface can be close to zero.

Should the surface consist of an electric conductive material, the better coupling between the transmission electrode TE and the reception electrode RE, through radiation of the compensation electrode signal CE (the emitted alternating electric field thereof operates on the surface as well) is nullified. In the amperage generated on the reception electrode RE, no significant difference results, depending on the support material.

A current quantity sufficient for the "awakening" from the transmission electrode TE to the reception electrode RE through the surface and/or the wall of the remote control device, is prevented with the aid of the emitted alternating electric field of the compensation electrode CE.

When a human hand $D_1$ (as shown in FIG. 2b) approaches the remote control device, the current in the reception electrode exceeds a predetermined threshold value of $I_o$ to switch or awaken the remote control device. The threshold value $I_0$ is preferably determined considering the E-Field-characteristics surrounding the remote control device, therefore an additional compensation electrode CE can be provided for adjustment.

When a hand $D_1$ is approaching, the increased current flow results from the reducing damping signal between the transmission electrode TE and the reception electrode RE. For this purpose two effects play an essential role:

a) the coupling of the first electrode with the thumbs improves (depending on which hand touches the remote control device, the first electrode is the transmission electrode TE or reception electrode RE). The hand, from the thumb to the four fingers, has very small impedance. The coupling of the four fingers onto the second electrode also improves. b) the signal path (transmission/reception electrode-hand-reception/transmission electrode) conducts the compensation electrode CE, so that the influence of the alternating electric field of the compensation electrode CE on the alternating electric field coupled with the reception electrode RE decreases.

In this way the alternating field transmitted through the hand from the transmission electrode TE to the reception electrode RE also experiences an increasing weaker compensation through the alternating electric field of the compensation electrode CE. It is in this important that the effect of compensation electrode CE in the entire system is not excessively dominant; otherwise the approach of a human hand would be "electrically hidden".

Should subsequently the remote control device be eventually fully gripped by a human hand $D_2$ (of FIG. 2c), the current in reception electrode RE would exceeds another predetermined threshold value $I_1$, to activate the remote control device completely. The threshold value $I_1$ is also preferably determined taking into account the E-Field-characteristics surrounding the remote control device, previously possessed by the device on the support without approach of a human hand. Should a hand-held device be equipped with two or more electrode systems, the threshold values $I_0$ and $I_1$ for each electrode system can be differently defined.

It is advantageous when the electrodes are so arranged to one another, that levels and impedances behave to one another as follows:

$$\frac{P_1}{P_2} < \frac{Z_2}{Z_1}$$

in which $P_1$ the level of the resulting alternating field in the first approach (=hand approach, in which the device shifts from the sleeping mode to the switch mode),
$P_2$ the level of the resulting alternating field in the second approach (=hand approach, in which the device shifts from the switch mode to the active mode),
$Z_1$ the impedance between the transmission electrode and the reception electrode in the first approach, and
$Z_2$ the impedance between the transmission electrode and the reception electrode in the second approach.

An electrode arrangement, meeting this requirement, can be empirically determined. With an electrode arrangement meeting these requirements, the sensitivity of the electrode arrangement can improve, as a hand approaches the device.

The alternating electric field emitted from the compensation electrode CE contributes only marginally to a level reduction in the receiver in the almost direct coupling (when a hand grips the remote control device completely) of transmission electrode TE and reception electrode RE through a human hand.

Figure 3:
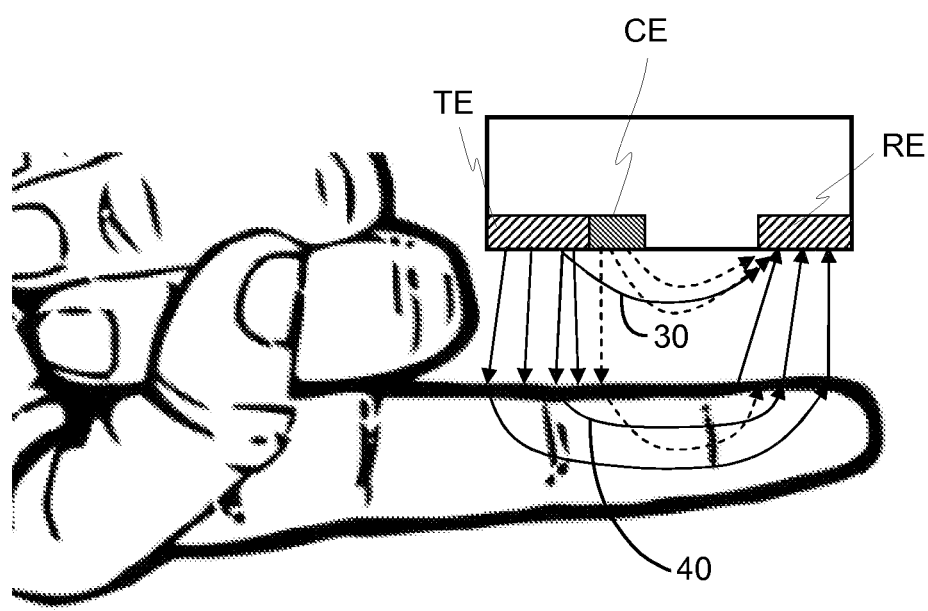
FIG. 3 a principle sketch to illustrate the field bridging.

FIG. 3 shows on the basis of a principle-sketch the coupling of the transmission electrode TE and the reception electrode RE.

The alternating electric field radiated on the transmission electrode TE is coupled in the finger. However, a part of the alternating electric field of the transmission electrode TE is also coupled in the reception electrode RE. The alternating electric field radiated on the compensation electrode CE (as indicated with dashed arrows) is also partially coupled in the human finger and partially in the reception electrode RE.

The influence of the alternating electric field of compensation electrode CE on the alternating electric field of the transmission electrode TE outside the fingers (reference mark 30) is preserved. The alternating field radiated from the transmission electrode TE, which operates directly on the reception electrode RE, experiences through the alternating field of the compensation electrode CE an actual level reduction.

The influence of the alternating electric field of compensation electrode CE on the alternating electric field of the transmission electrode TE in the finger (reference sign given 40) is instead smaller, which leads to an actual increase of the current at reception electrode RE. This can be achieved for example, as the transmission electrode TE and the compensation electrode CE are laid out in such a way, that the electric field strength at the compensation electrode CE is smaller than the electric field strength at transmission electrode TE. Thus, a coupling between the transmission electrode TE and the reception electrode RE is produced through the finger, which withdraws at least partially from the influence sphere of the compensation electrode.

Figure 10:
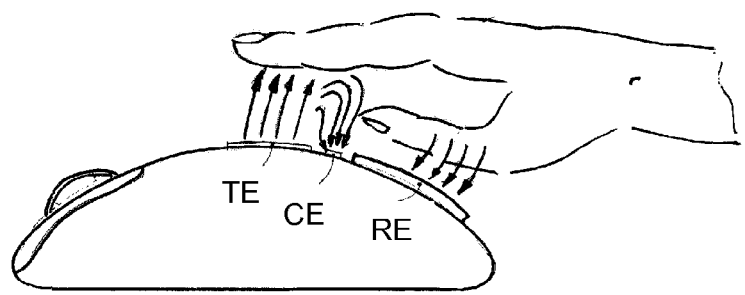
FIG. 10 a principle sketch to illustrate the field bridging in the electrode arrangement according to FIG. 2.

With reference to FIG. 10 the coupling of the transmission electrode TE and the reception electrode RE as well as the influence of the alternating electric field of the compensation electrode CE on this coupling is explained once more with the example of a computer mouse.

In a further embodiment the compensation electrode can also be used to determine the characteristics of the E-field surrounding the remote control device, in order to perform self-adjustment of the system.

Figure 4:
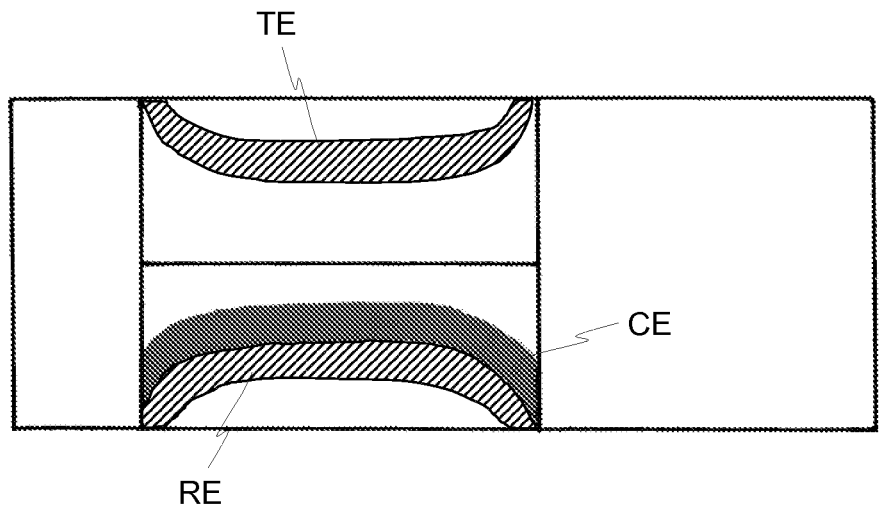
FIG. 4 an asymmetric electrode arrangement (above) for the right/left-distinction with two corresponding current courses on the reception electrode (below)
Figure 4:
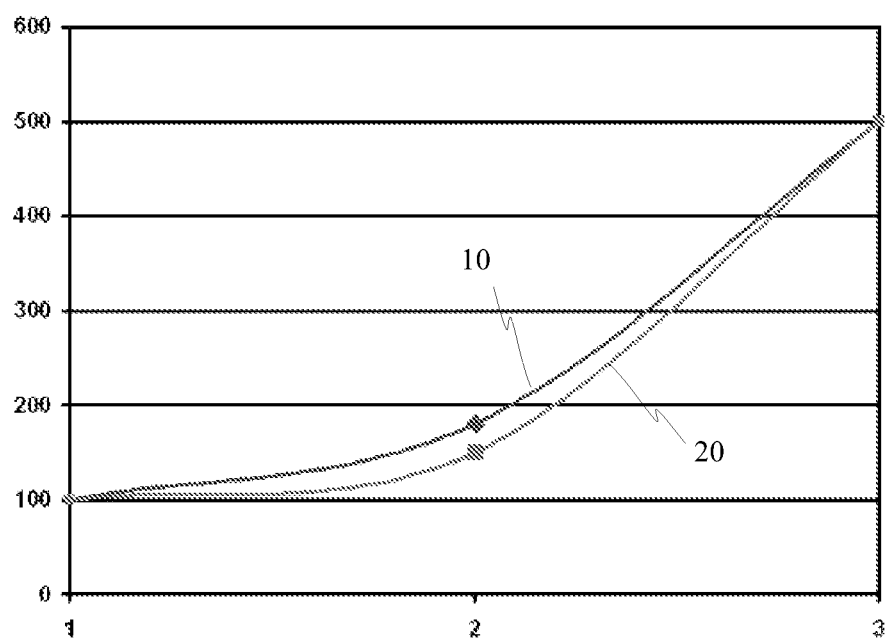

FIG. 4 shows an asymmetric arrangement of the electrodes at the bottom of a remote control device. In this way a right/left-distinction of an approach to a remote control device can be performed. A time course of the current at reception electrode RE according to the approach direction is shown in the FIG. 4 chart, in which the characteristic curve 10 represents a right approach and the characteristic curve 20 a left approach. In this way a right-handed approach can also be easily distinguished from a left-handed approach.

Figure 5:
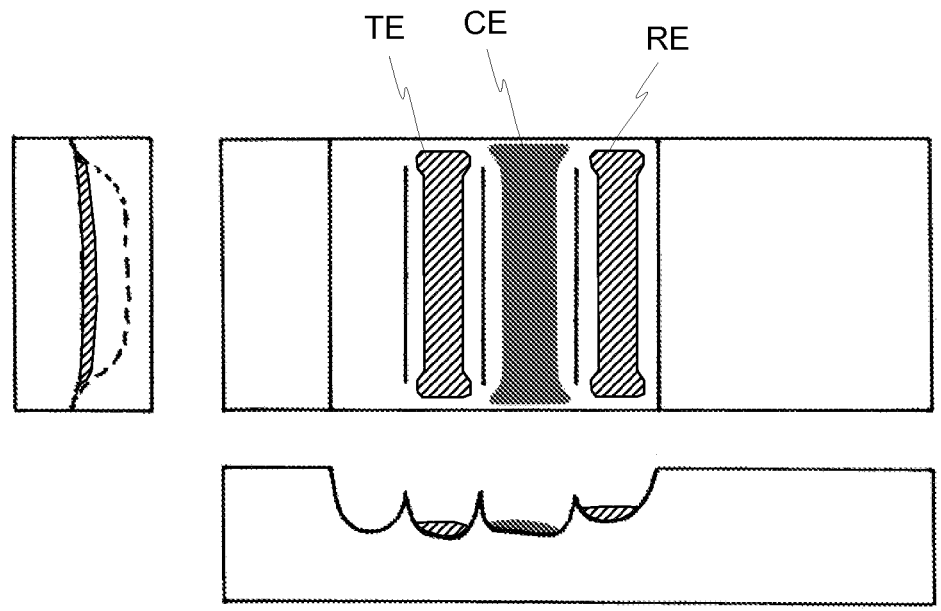
FIG. 5 an alternative electrode arrangement on a hand-held device.

FIG. 5 shows an alternative arrangement of the electrodes at the bottom of a remote control device. At least three electrodes TE, CE and RE are introduced in the troughs of the ribs, provided for the single fingers in a device wall. Thereby by means of the current path generated in the hand from the transmission electrode TE to the reception electrode RE the alternating electric field of compensation electrode CE is bypassed.

According to various embodiments there several transmission electrodes TE, reception electrodes RE and compensation electrodes CE can also be provided on a remote control device or on any other electric hand-held device, for example a computer mouse. Arrangement alternatives of the electrodes into a computer mouse are shown from FIG. 13a to FIG. 13j.

According to various embodiments several electrode structures can be also arranged on a hand-held device, in which each of the electrode structures has a transmission electrode, a reception electrode and a compensation electrode. Each of the electrode structures is preferably laid out in such a way that, with each of the electrode structures a detection of an approach or contact to the hand-held device according to the above principle is possible.

Figure 6:
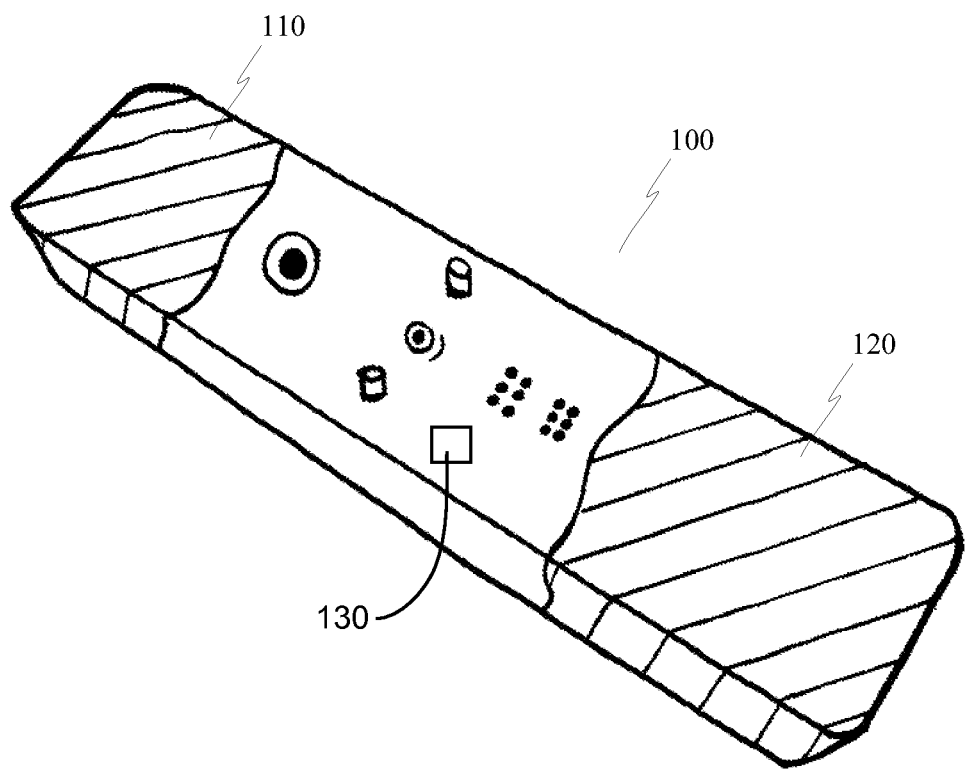
FIG. 6 an input device with two zones each provided with an electrode structure.

An example of a hand-held device with two electrode structures is shown in FIG. 6. FIG. 6 shows an input device 100, representative of other hand-held devices, for a game console. The input device 100 has two proximity or contact sensitive areas 110 and 120. In these areas below the casing surface one of the above-mentioned electrode structures is arranged. The electrode structures are not shown in FIG. 6. The electrode arrangement of an electrode structure on the input device can be for example chosen in such a way as shown with reference to FIG. 1.

Both sensitive electrode structures associated with the areas 110 and 120 are coupled with an evaluation electronic device, which is not shown here. They can retrieve the approach to an electrode structure in succession. For this purpose, the electronic evaluation device can be coupled for example with a multiplexer on the electrode structures.

Alternatively an electronic evaluation device can be provided for each of the electrode structures.

With both electrode structures it can be now distinguished, where the input device 100 is touched. According to which area 110, 120 is touched or which area a hand or both hands of a user is/are approaching, the electronic evaluation device can activate or perform different functions of the input device.

Figure 7:
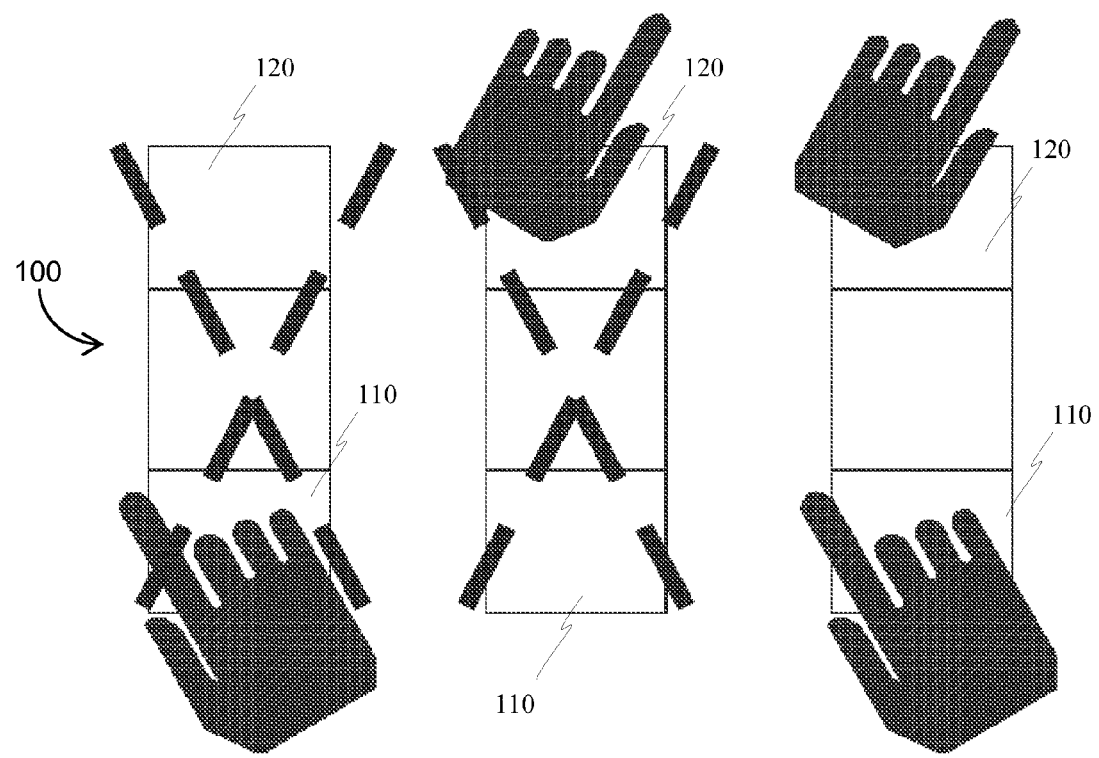
FIG. 7 examples of the detection of the approach to a hand-held device or of a contact with a hand-held device provided with several electrode structures.

FIG. 7 shows three examples for the detection of an approach to an hand-held device and/or the contact of a hand-held device with several electrode structures. A so-called "Game-Controller" 100 is here shown as an example, which, as already shown in FIG. 6, has two proximity or contact sensitive zones 110 and 120. The Game-Controller 100 can be used here e.g. as a golf club for a golf game, played with a game console. A golf club for a golf game must be held with both hands, so that contact only with the sensitive area 110 (left illustration in FIG. 7) or only with sensitive area 120 (middle illustration in FIG. 7) does not determine any function in the golf club, or ignores the game console movements of the Game-Controller 100. Alternatively the Game-Controller 100 can indicate the user that the Game-Controller 100 needs to be held with both hands (right drawing in FIG. 7), to be used as golf club.

Such a function is not only limited to Game-Controller, but can be provided on various hand-held devices, for example a mobile phone or a MP3-player.

Likewise more than two electrode structures shown in FIG. 6 and FIG. 7 can be provided. So with three electrode structures three sensitive areas separated from each other can be arranged on a hand-held device for example, as for example a Game-Controller.

A combination with other sensor data, which are determined through appropriate means in or on the hand-held device, is also possible. So the shaking of a MP3-player, which can for example be detected through positioning sensors or acceleration sensors 130 as for example shown in FIG. 6, can cause different actions, depending on where the MP3-player is held. If the MP3-player is held in the area of a keyboard, the shaking can cause a change in the order of the music tracks, whereas holding it on the display during shaking determined a random selection of another music track.

An embodiment on the basis of a computer mouse is explained below.

Figure 8:
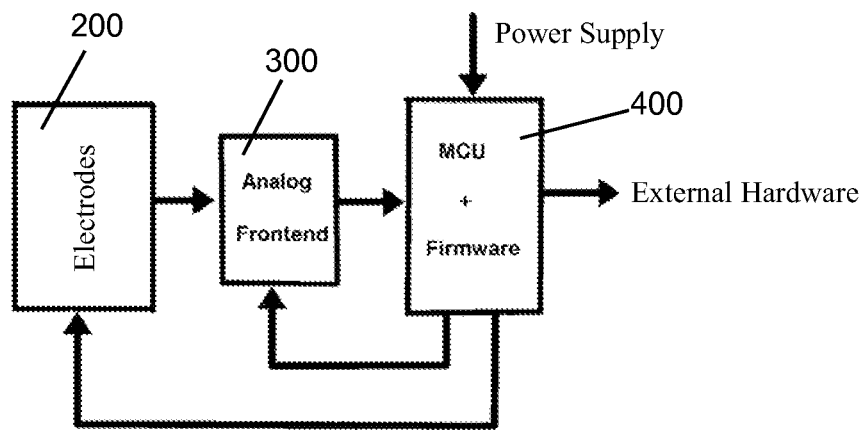
FIG. 8 a circuit arrangement according to an embodiment for electric-field approach detection for the power-up and power-down of a cordless computer mouse.

As illustrated in FIG. 8 the solution according to various embodiments lies in the particular combination of three main modules.

The first main module 200 comprises three E-field electrodes for the detection of an approaching human hand.

The second main module 300 accomplishes an analogue signal processing of the signals delivered form the first main module.

The third main module 400 is performed as a signal control unit (MCU) and conduces the signal control of the two aforementioned main modules and delivers the information obtained from the E-field to a connected external hardware.

The single modules are now described with more details.

Figure 9:
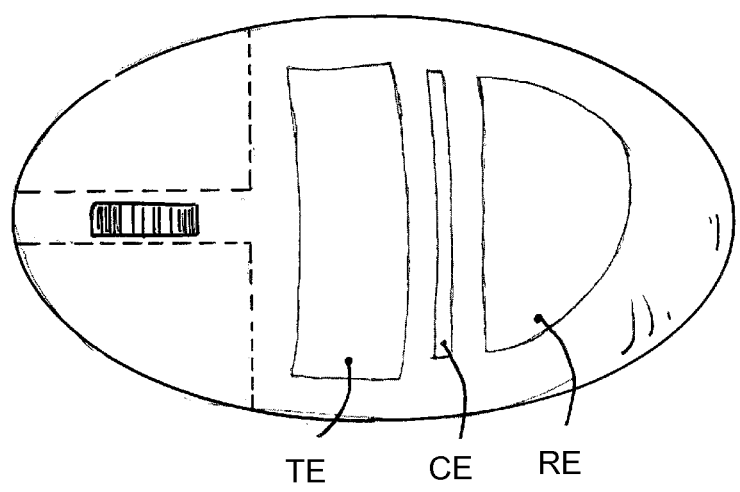
FIG. 9 a principle sketch to illustrate a first electrode arrangement.

A) the First Main Module 200—the E-Field Electrodes:

A particularly advantageous arrangement of the electrodes is illustrated in FIG. 9. On the upper side of a computer mouse three E-field electrodes TE, CE, RE are placed. The wider electrode TE (=transmission electrode) is supplied with a switching signal, which can have a frequency between 50 KHz and 300 KHz and a signal amplitude that should not exceed 20V value. The electrode CE (=compensation electrode), which may need a smaller surface than the electrode TE, is also supplied with the electric signal form of the electrode TE. The difference of the electric signals representing a detection feature between the electrode TE and the electrode CE is a phase difference from −140° to +140°. Moreover a signal amplitude difference between both the electrodes can be also advantageous for the desired, where necessary also spatially-directed, detection performances of the electrode arrangement.

The electrode RE (=receiver electrode) is connected to the signal input in the downstream analogue signal processing.

In FIG. 10 the interaction of this arrangement is further illustrated. The three electrodes on the computer mouse are construed in such a way that upon sufficient withdrawal or complete absence of a hand, the influencing E-field at the electrode RE, through the emitted E-field of the electrode TE with the help of the phase-delayed emitted E-field of the electrode CE, is extinguished. If a human hand approaches a computer mouse below a minimum distance, a new current path through the hand from the electrode TE to the electrode RE is generated, which withdraws the influence sphere of the electrode CE and leads to a significant current rise at the electrode RE.

Figure 11:
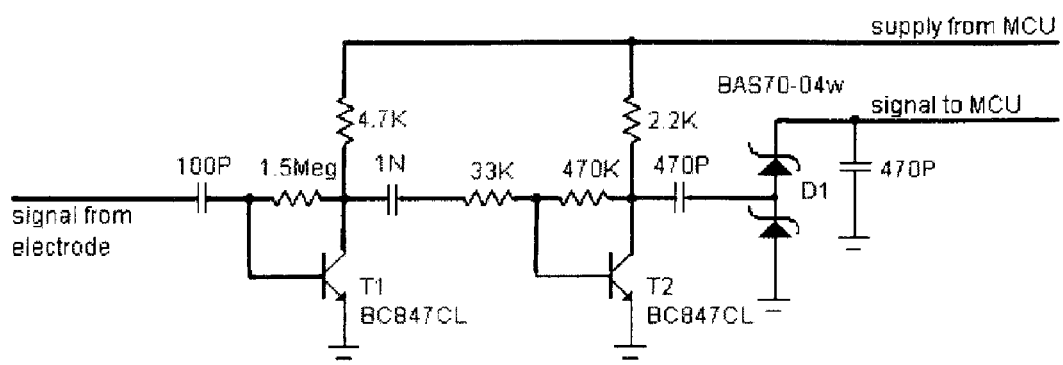
FIG. 11 a circuit sketch to illustrate a preference structure of a tapping circuit according to an embodiment, used for signal processing.

B) The Second Main Module 300—the Analogue Signal Processing:

In FIG. 11 a preference circuit structure of an analogue signal processing for a cordless computer mouse is illustrated. The wiring of T1 is construed in such a way, that on one hand the impedance at the signal input of the module in the working frequency range reaches a minimum, and on the other hand the signal amplification, with the help of each component and its smallest possible steepness, experiences a stable operational maximum.

The following signal reinforcements of T2 as well as the output impedance of this component are construed in such a way, with the aid of D1, in order to obtain at the signal exit of the module a directly deduced DC-signal of the AC-signal of the signal input of the module as quickly as possible and with no need of a high energy supply.

Figure 12:
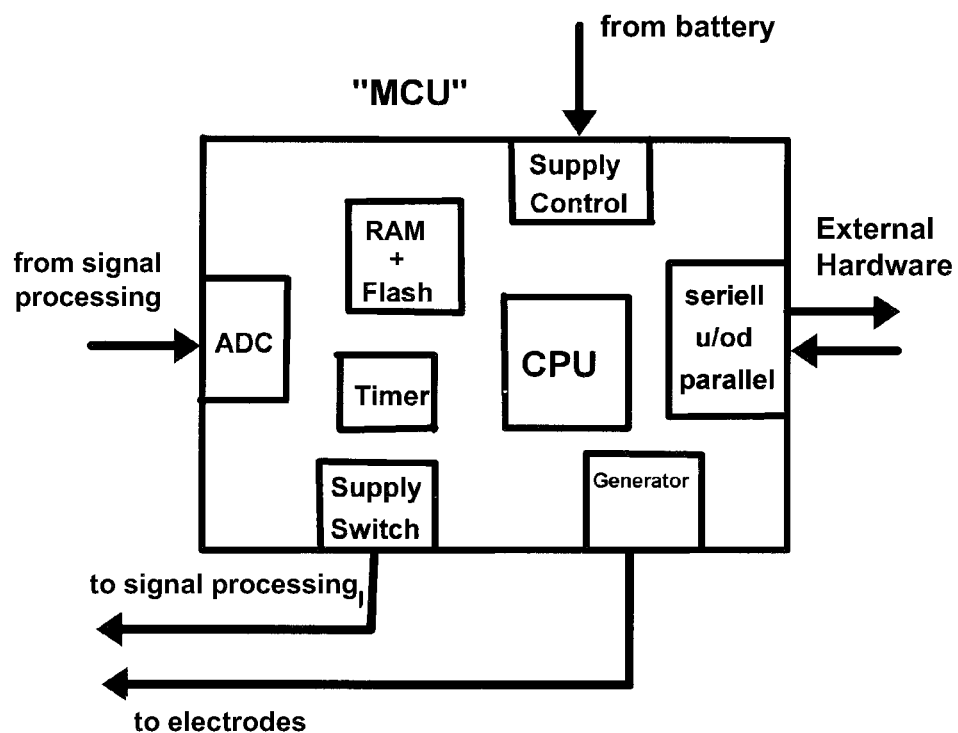
FIG. 12 a principle sketch to illustrate a preference structure of the MCU working as operating circuit and as interface for external hardware.

C) The Third Main Module 400—the Signal Control Unit (MCU):

In FIG. 12 a particularly advantageous embodiment of a signal control unit for a cordless computer mouse is illustrated. The signal control unit consists of a central MCU. The signal processing process processed through this module can include the following possible functions:

- the MCU generates, with the help of its timers, periodically timing slots, e.g. 1 ms, in which the performing tasks of all three modules are worked out (=active phase); these timing slots can be expanded or shortened if necessary. FIG. 12 also shows, that the MCU further provides the remaining time intervals, e.g. 100 ms, a minimal current need of all three modules (=resting phase); these intervals can be arbitrarily expanded or shortened e.g. through changes of the registered quantities in the active phase.
- the MCU supplies in the active phase the analogue signal processing with energy supply, with the help of its supply switches only for the shortest necessary time lapse.
- the MCU generates in the active phase for a predefined time lapse the required switching signals for both E-field electrodes TE and CE; this lapse can arbitrarily be expanded or shortened.
- the MCU measures its actual operating voltage with the help of its A/D-converter inside the active phase and includes this/those measurement(s) into the successive result calculations.
- the MCU detects the alternating voltage-/pulsating voltage quantity in the active phase with the help of its A/D-converter to fixed predefined points of time, which have generated the analogue signal processing, at their signal input, or at their signal inputs.
- the MCU evaluates in the active phase, with the help of the CPU, RAM, flash and the algorithms included in its firmware, all measurements, draws logical conclusions and determines the following performing actions of all modules involved.
- the MCU optionally transmits in the active phase its information to a connected external hardware, e.g. a Wake-Up signal, with the help of its serial and/or parallel interface module.
- the MCU optionally waits in the active phase for an answer/signal from a connected external hardware, e.g. a Go-To-Sleep-signal, when an external routine has been processed. the MCU itself shifts at the end of the active phase into a sleep-mode (=low-power-mode), from which it can revert independently and/or through an external electrical signal.

The concept according to various embodiments leads to an increase in the lifetime of employed energy storage systems, e.g. batteries, through the combination of "the look into the future" with the help of the detection performed by means of E-fields of an approaching person, and the optimized interaction of a specifically adapted analog-front-end together with all process controlling MCU, as well as to a reduction/elimination of the "perceived" reaction time by a user, using e.g. a computer mouse with this technology. Loss of the "perceived" reaction time can be approximately reached through the above-described first threshold value I0, at which the computer mouse shifts from the sleeping mode into a waking-up mode.

As for its geometric construction and arrangement at the computer mouse the electrodes can also be differently arranged relatively to the above described embodiments.

Several possible variants of an electrode arrangement on a computer mouse are shown below. These different electrode arrangements can also be provided in other hand-held devices.

FIG. 13a shows an axisymmetric arrangement, in which the transmission and the reception electrodes are turned 180°.

FIG. 13b shows an axisymmetric arrangement, optimized as for its detection range.

FIG. 13c shows a half-rotationally symmetrical arrangement of all electrodes.

Figure 13D:
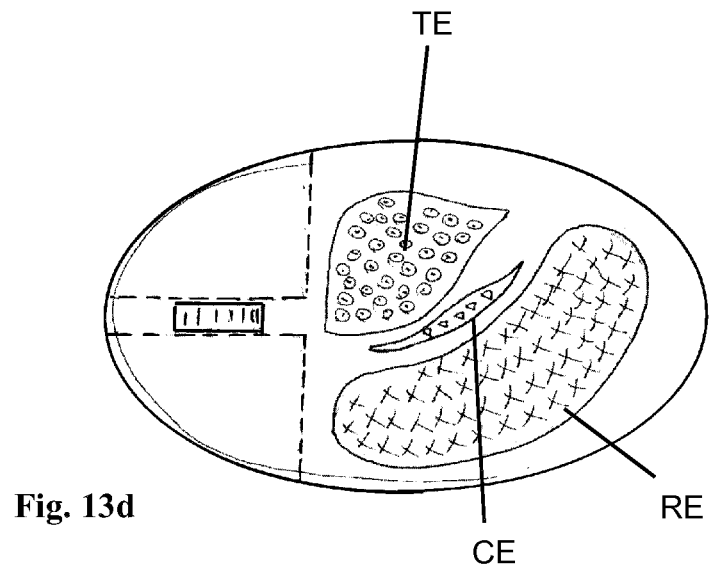

FIG. 13d shows an arbitrarily turned arrangement, here about 45°, of all electrodes.

Figure 13E:
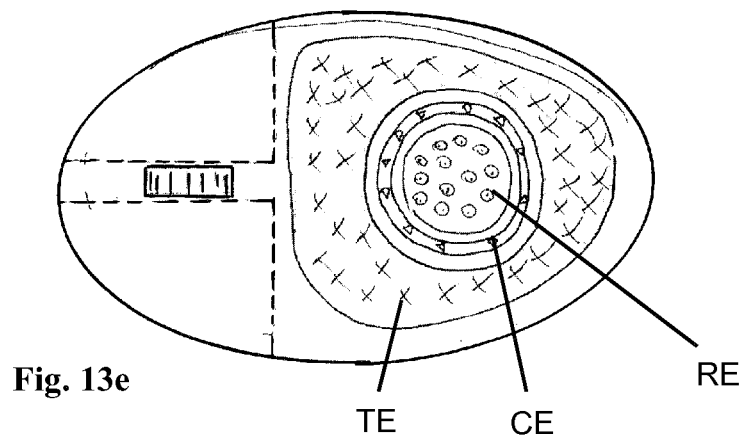

FIG. 13e shows a fully-rotationally symmetrical arrangement of all electrodes.

Figure 13F:
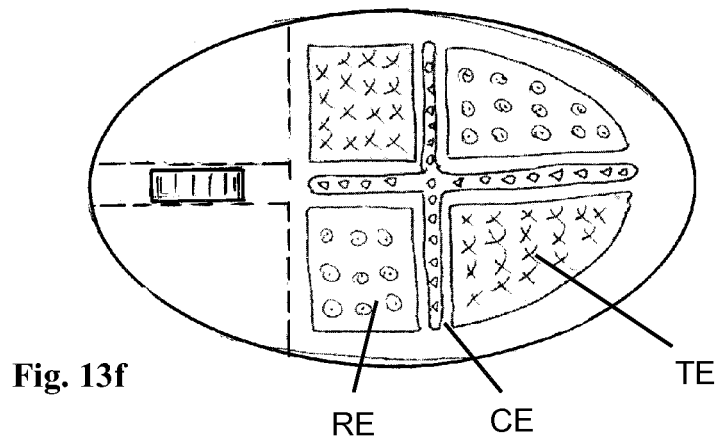

FIG. 13f shows a multi-split transmission electrode TE and receiver electrode RE in point-symmetric arrangement. Through this construction the detection of gestures is especially possible in an advantageous way. An e.g. top right approach differs from a bottom left approach in that, the currents in the respective reception electrodes are (clearly) different.

Figure 13G:
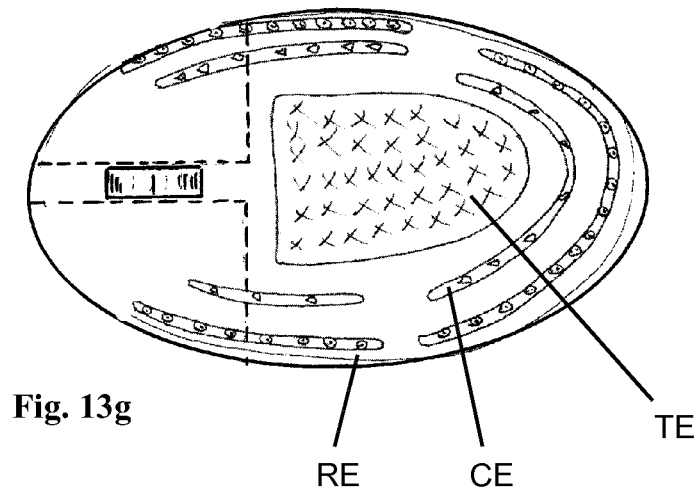

FIG. 13g shows a multi-split lateral reception electrode RE in point-, axis-, or asymmetric arrangement. Through this construction the detection of gestures is also possible in an advantageous way. The approach direction can be detected as well, since according to the approaching direction in the reception electrodes RE the currents are each time different. Sideways transmission electrodes TE can also be applied.

Figure 13H:
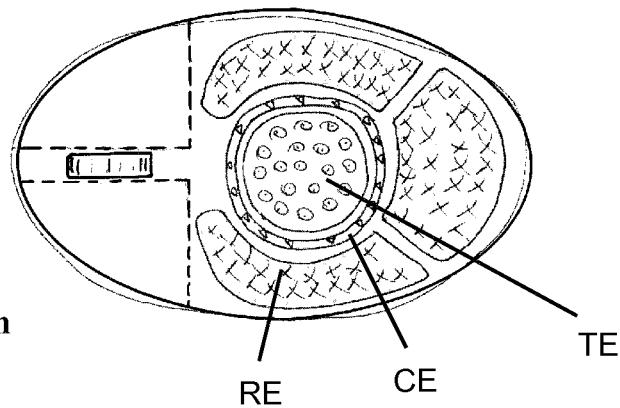

FIG. 13h shows a multi-split receiving electrode in a fully-rotationally symmetrical arrangement. Thereby a detection of gestures as well as of approaching direction is possible.

Figure 13I:
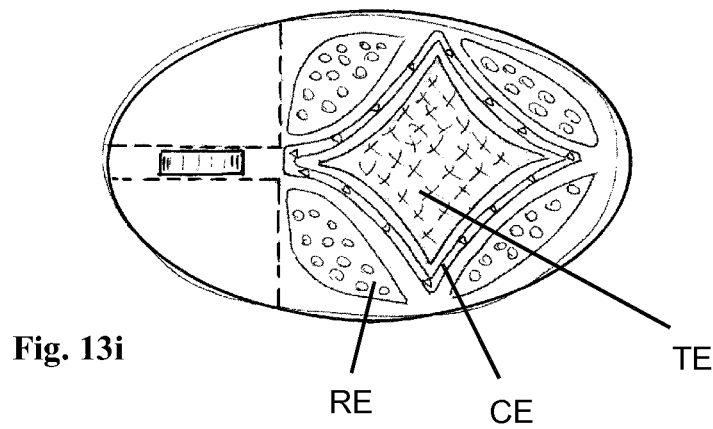

FIG. 13i shows a multi-fragmented transmission electrode in a double axis-symmetric arrangement. The detection of gestures is here possible.

Figure 13J:
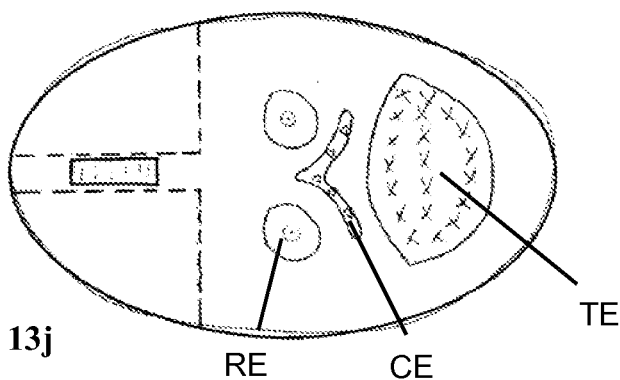

FIG. 13j shows a fun design with the help of electrodes, which can contain axis- or point-symmetries of some/all electrodes or be completely asymmetric as well. The detection of gestures is here possible.

Alternatively to performance of the E-field electrodes as correspondingly formed and inserted, or made of metallic surfaced sections electrode components, it is also possible to develop them using one single or additional plastic material and/or casing material in and/or below the surface of the overall device/operating area.

Figure 14:
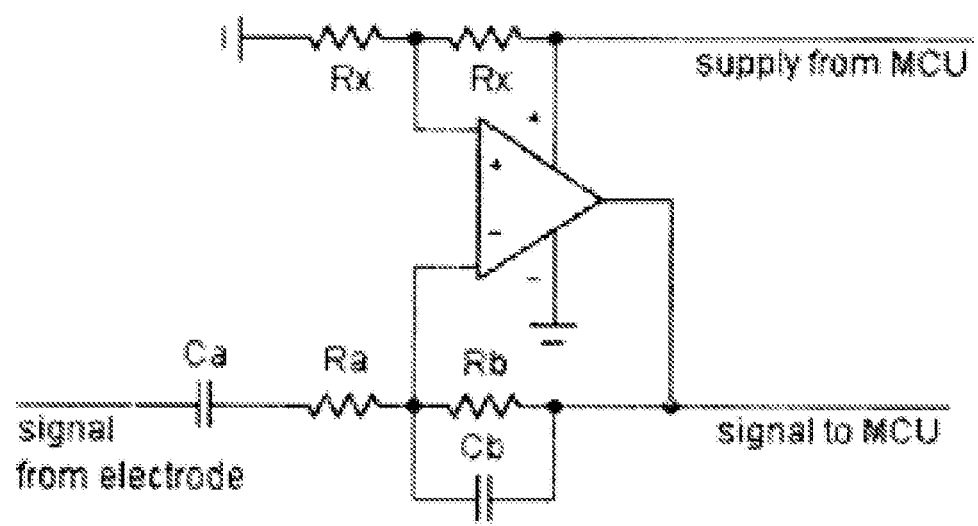
FIG. 14 another circuit sketch to illustrate the structure of a further signal-processing module.

Moreover it is also possible to implement the circuit with the construction shown in FIG. 14. In case of a circuit design shown in FIG. 14 the analogue signal processing is made with the help of a computing amplifier, which is wired up in a form, so that at its signal exit a copy of reception electrode current is generated (here an arrangement without a downstream DC-rectification). Ca, Ra, Cb and Rx components are optionally necessary, for Rb a discrete or indirect form of its realization is recommended. Moreover it is possible to quit the A/D-converter in the signal control unit and instead to process the further logic actions on the basis of the results of one or several comparators.

The invention claimed is:

1. An electrode system for an arrangement at a hand-held device comprising
    at least a transmission electrode, a reception electrode and a compensation electrode, wherein the compensation electrode is arranged between the transmission electrode and the reception electrode, wherein the electrode system is further configured
    to emit a first alternating electric field from the transmission electrode and a second alternating electric field from the compensation electrode, wherein the first alternating electric field is phase-delayed with respect to the second alternating, electric field and wherein the first and second alternating electric fields are coupled into the reception electrode.

2. The electrode system according to claim 1, wherein upon approach of a hand to the electrode system the electrode system is further operable to generate a current by the first and second alternating electric fields in the reception electrode which is representative of the approach of the hand.

3. The electrode system according to claim 2, wherein the transmission electrode and the reception electrode are arranged on the hand-held device in such a way, that the impedance between the transmission electrode and the reception electrode, when a hand-held device is placed on a surface exceeds a predetermined value, which is suitable to keep the current generated in the reception electrode under a predetermined value.

4. The electrode system according to claim 3, wherein the impedance between the transmission electrode and the reception electrode is the sum of the impedances between the transmission electrode and the reception electrode, which consist of
    the impedance between transmission electrode and surface,
    the impedance of surface and
    the impedance between surface and reception electrode.

5. The electrode system according to claim 1, wherein the electrode system is coupled with an evaluation circuit which is configured to evaluate an approach of a hand to the electrode system and to provide a representative signal for an approach.

6. The electrode system according to claim 5, wherein the evaluation circuit comprises an amplifier having an impedance at a signal input which reaches a minimum in a working frequency range.

7. The electrode system according to claim 6, wherein the evaluation circuit generates a directly deduced DC-signal from a received AC signal.

8. The electrode system according to claim 5, wherein the evaluation circuit further comprises a microcontroller.

9. The electrode system according to claim 6, wherein the evaluation circuit further comprises a microcontroller comprising an analog-to-digital converter receiving an output signal of said amplifier.

10. The electrode system according to claim 9, wherein the electrode system is battery operated.

11. The electrode system according to claim 8, wherein the microcontroller is configured to generate an alternating signal for generating said first and second alternating electric fields.

12. The electrode system according to claim 9, wherein the microcontroller is configured to generate said alternating signal during periodic time slots having a predefined duration.

13. The electrode system according to claim 10, wherein a time slot duration can be shortened or expanded during operation of the electrode system.

14. The electrode system according to claim 10, wherein the microcontroller is configured to enter a sleep mode or an active mode depending on an evaluation performed during one of the periodic time slots.

15. The electrode system according to claim 1, wherein the compensation electrode has a smaller surface than a surface of the transmission electrode.

16. The electrode system according to claim 1, wherein an amplitude of a signal fed to the compensation electrode is different than an amplitude of a signal fed to the transmission electrode.

17. The electrode system according to claim 1, wherein the electrodes are arranged on a surface of a mobile device.

18. The electrode system according to claim 1, wherein the mobile device is a computer mouse.

19. The electrode system according to claim 1, wherein the transmission electrode, compensation and reception electrodes are arranged asymmetrically.

20. The electrode system according to claim 1, wherein the transmission electrode, compensation and reception electrodes are arranged in a half-rotationally asymmetrical arrangement.

21. The electrode system according to claim 1, wherein the transmission electrode, compensation and reception electrodes are arranged in a fully-rotationally symmetrical arrangement.

22. A hand-held device with at least one electrode system according to claim 1, wherein the hand-held device is selected from the group consisting of a computer mouse, a remote control device, a mobile phone and an input device for a game console.

* * * * *